(12) United States Patent
Schmid

(10) Patent No.: US 9,270,240 B2
(45) Date of Patent: Feb. 23, 2016

(54) CIRCUIT LAYOUT AND METHOD FOR FREQUENCY-DEPENDENT MATCHING OF A HIGH-FREQUENCY AMPLIFIER STAGE

(71) Applicant: EADS Deutschland GmbH, Ottobrunn (DE)

(72) Inventor: Ulf Schmid, Ulm (DE)

(73) Assignee: Airbus Defence and Space GmbH, Ottobrunn (DE)

( * ) Notice: Subject to any disclaimer, the term of this patent is extended or adjusted under 35 U.S.C. 154(b) by 0 days.

(21) Appl. No.: 14/277,951

(22) Filed: May 15, 2014

(65) Prior Publication Data

US 2014/0340159 A1  Nov. 20, 2014

(30) Foreign Application Priority Data

May 16, 2013 (EP) ..................................... 13002563

(51) Int. Cl.
*H03F 3/191* (2006.01)
*H03F 3/19* (2006.01)
*H03F 1/56* (2006.01)
*H03F 3/193* (2006.01)

(52) U.S. Cl.
CPC ................. *H03F 3/19* (2013.01); *H03F 1/565* (2013.01); *H03F 3/193* (2013.01); *H03F 2200/165* (2013.01); *H03F 2200/171* (2013.01); *H03F 2200/387* (2013.01); *H03F 2200/451* (2013.01)

(58) Field of Classification Search
USPC .................................................. 330/306, 302
IPC ........................................................ H03F 3/191
See application file for complete search history.

(56) References Cited

U.S. PATENT DOCUMENTS 5,483,209 A    1/1996  Takayama
6,317,608 B1  11/2001  Glöcker

FOREIGN PATENT DOCUMENTS

| DE | 24 12 920 A1 | 9/1975 |
| DE | 198 23 060 A1 | 12/1999 |
| EP | 2 421 151 A2 | 2/2012 |
| JP | 2006-222629 A | 8/2006 |
| WO | WO 99/01931 | 1/1999 |

OTHER PUBLICATIONS

European Search Report dated Oct. 24, 2013 with partial English translation thereof {Six (6) pages}.

*Primary Examiner* — Patricia T Nguyen
(74) *Attorney, Agent, or Firm* — Crowell & Moring LLP

(57) ABSTRACT

A circuit for frequency-dependent matching of a high-frequency amplifier stage includes high-frequency stage with an output to a total high-frequency path that divides a total frequency band into a plurality of partial frequency paths for respectively preset partial frequency bands. The outputs of the plurality of partial frequency paths are reunited again into the total high-frequency path, following the processing of the partial frequency bands of these partial frequency paths. The partial frequency paths include a matching network surrounded by a first and second pass filter. At least one partial frequency path is switchable, when a control signal is supplied thereto.

8 Claims, 7 Drawing Sheets

CIRCUIT LAYOUT AND METHOD FOR FREQUENCY-DEPENDENT MATCHING OF A HIGH-FREQUENCY AMPLIFIER STAGE

CROSS-REFERENCE TO RELATED APPLICATIONS

This application claims priority under 35 U.S.C. §119 to European Patent Application No. 13 002 563.8, filed May 16, 2013, the entire disclosure of which is expressly incorporated by reference.

BACKGROUND AND SUMMARY OF THE INVENTION

Exemplary embodiments of the invention relate to a circuit layout and a method for frequency-dependent matching of a high-frequency amplifier stage according to the characteristics as specified in the independent claims.

Power amplifiers and their transistors are typically, inherently non-linear components; this means that, generally, they generate spectral content of integer multiples of the fundamental of the signal that is to be amplified, so-called overtones or harmonic partials. These overtones or harmonics negatively impact the signal spectrum in a variety of ways. On the one hand, they reduce the efficiency of the amplifier circuit, because a part of the expended DC power is not used for boosting the fundamental, as desired, but for generating power for the frequencies of the harmonics. On the other hand, they contaminate the spectrum of the amplified output signal. Depending on the application, expedient filtering is necessary to reestablish the spectral purity of the signal, for example of the radar transmission signal.

The phase response of an optimal complex load at the transistor output for achieving high efficiency in a reactively matched amplifier circuit is generally reversed over the frequency relative to the physically achievable phase response in passive matching circuits. This is why a wide-band, purely passive and non-adaptive implementation of the matching circuit always constitutes a compromise between wide-band capability, efficiency and output power.

In narrow-band implementations of amplifiers, it is possible to cut off one or a plurality of the overtones in a targeted fashion in an effort to improve efficiency ("harmonic matching"). However, this method is inapplicable for wide-band circuits, particularly those covering several octaves, because, in this context, the harmonics that must be suppressed fall within the useful band of the circuit and may, therefore, not be attenuated.

Tunable filters can be used for suppressing undesired spectral content, such as harmonics. However, due to the fact that these filters reflect the harmonics, they have a frequency-dependent feedback on the power amplifier and thus influence the properties of the same, with negative effects on the efficiency of the amplifier. Moreover, they themselves demonstrate great attenuation effects, particularly at high frequencies, that further reduce the efficiency of the total system.

German patent document DE 24 12 920 A1 discloses a circuit layout and a method for influencing signals that are to be transmitted in a frequency-dependent manner.

Exemplary embodiments of the present invention provide a wide-band amplifier circuit that suppresses undesired harmonics of an amplified signal and improves the efficiency of the amplifier circuit. Exemplary embodiments of the present invention also provide a method for suppressing undesired harmonics of an amplified signal, while simultaneously increasing the efficiency of the amplifier circuit.

The circuit layout for frequency-dependent matching of a high-frequency amplifier stage according to the invention comprises an HF amplifier stage, where an HF total path, which routes the total frequency band, is divided at the output into a plurality of partial frequency paths (referred to below as partial paths) for the respective preset partial frequency bands and, after the processing of the partial frequency bands in the partial paths, these partial paths are reunited into the high-frequency total path. According to the invention, the partial paths comprise a pass-filter on the input side and a pass-filter on the output side for a preset partial frequency band, respectively, as well as a matching network for matching the amplifier stage in the preset partial frequency band. According to the invention, at least one partial frequency path is switchable, when a control signal is supplied thereto.

In one advantageous embodiment of the invention, the partial frequency path can be grounded. Expediently, at least one switch is provided on the input and output sides of the matching network of a partial frequency path, such that, upon supplying a control signal, the switch shorts the partial frequency path to ground, whereby signals in this partial frequency path are reflected.

In one further advantageous embodiment of the invention, at least one partial frequency path can be decoupled from the circuit layout, when a control signal is supplied. Expediently, the decoupling action is achieved by the use of one or several multi-circuit switches that are inserted in the at least one partial path.

In other words, the circuit layout according to the invention is based on the idea of dividing the total useful band of the HF amplifier into two or more partial bands and of distributing the output signal of the HF amplifier, for example of a transistor, over two or more partial paths (channels), preferably using a frequency-dividing network (a duplexer or triplexer, etc.) depending on the partial frequency band. In each partial path, the corresponding spectral content of the output signal is processed in a matching circuit. Undesired spectral content can be shorted to ground the respective partial path or suppressed by opening alternate multi-circuit switches in the respective partial path; and they are thus no longer consequential for the HF total signal, after the individual partial paths have been reunited into the total HF path.

In contrast to a circuit layout according to the prior art, where a single matching circuit covers the total bandwidth in a non-adaptive manner, the circuit layout according to the invention allows for better approximation of the optimum load for maximum efficiency. Furthermore, there exists the possibility of expediently terminating not only the fundamental but also the harmonics to achieve maximum efficiency. For example, if a standard bandwidth ("fractional bandwidth") that is greater than 2:1 is to be implemented, when dividing the total HF path into a lower and an upper partial path, the matching circuit for the upper frequency band is also, additionally, switchably configured in order to be passable, depending on the frequency range of the signal that is to be amplified, either for high frequencies or, when the signal that is to be amplified is in the lower partial band, to expediently terminate the harmonics that are generated by the amplifier stage. Moreover, dividing the total useful band into two or several partial bands also results in a reduction of the complexity of the individual matching networks within the partial paths relative to the complexity of a single matching network for the total bandwidth; as a consequence, fewer passive components, such as coils, capacitors and impedance-transforming lines are needed, thus resulting in fewer losses in the matching networks of the individual partial paths.

Using the circuit layout according to the invention, dependent on the frequency of the fundamental that it to be amplified, the HF amplifier stage is always offered the optimally suited complex load both for the fundamental as well as the harmonics, which is necessary for maximum effectiveness of the total system. Due to the fact that, when the total band is divided into the individual partial bands thereof by means of the frequency-dividing network that is preferably employed, it is not obvious as to whether a spectral content of a partial band is in fact the desired amplified signal of the fundamental that is to be amplified or as to whether this spectral content is in fact the undesired harmonic of a signal that is to be amplified in a lower frequency band; as a remedy, a control signal for the suppression of harmonics, is supplied at least to one partial path, preferably several partial paths, and wherein the control signal was generated, for example, in a signal processing electronics unit.

The method according to the invention is substantially characterized by the fact that a control signal is supplied to at least one partial frequency path, and that this at least one partial frequency path is shorted to ground; or by the fact that, by way of a variant of the invention, the same is decoupled from the rest of the invention. Expediently, the control signal is supplied to that partial frequency path that contains an undesired harmonic of the signal that is amplified by the high-frequency amplifier stage. This undesired harmonic is eliminated by the method according to the invention in the total band of the signal that is amplified by the HF amplifier stage.

BRIEF DESCRIPTION OF THE DRAWING FIGURES

The invention and further advantageous embodiment of the invention will be illustrated in further detail below. Shown are as follows.

DETAILED DESCRIPTION

Figure 1:
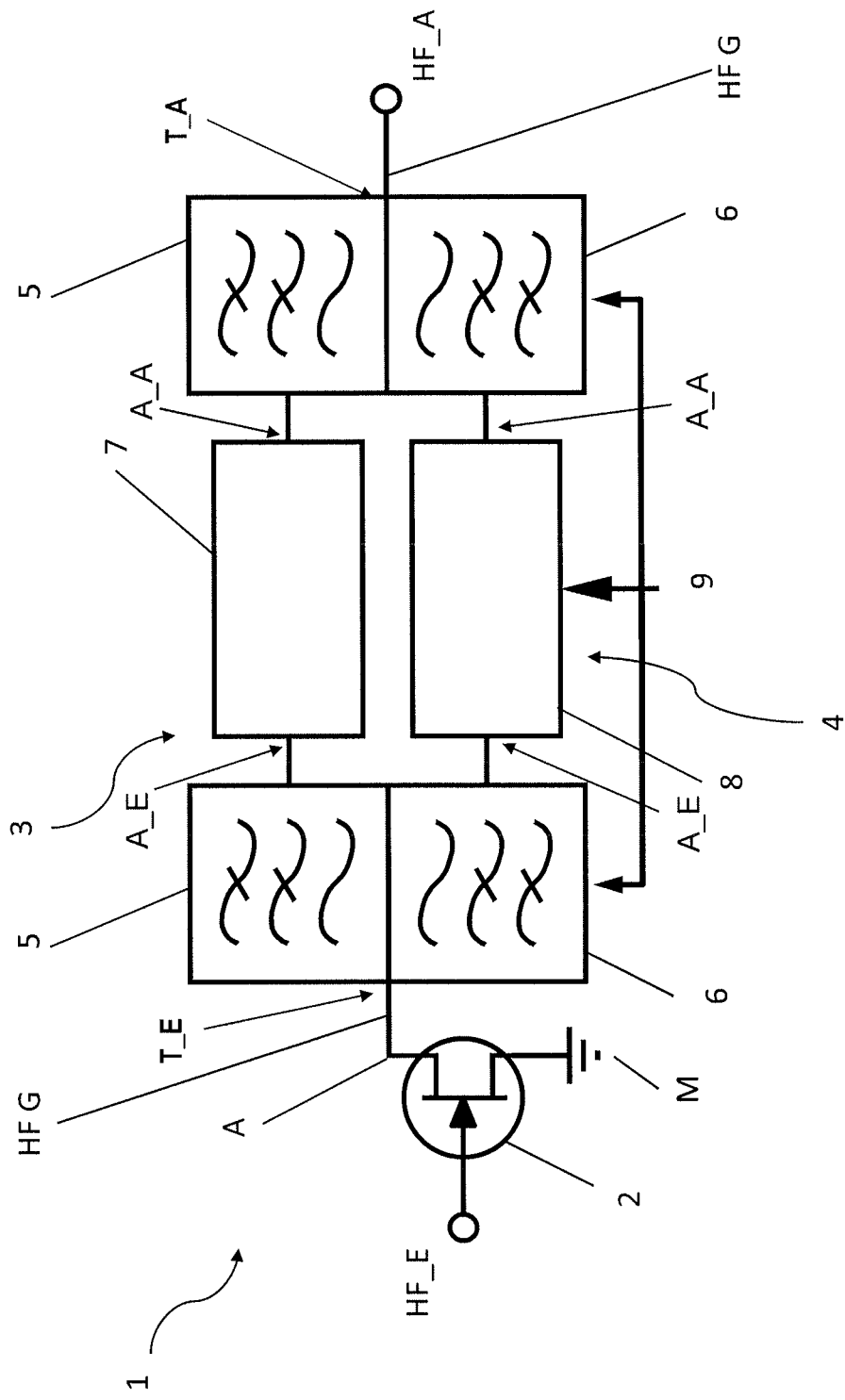
FIG. 1 is a representation of a schematic circuit diagram of the circuit layout according to the invention.

FIG. 1 shows the schematic circuit diagram of a circuit layout according to the invention. The circuit layout 1 includes an HF input HF_E and an HF output HF_A. The HF signal of the circuit layout 1 that is to be amplified is fed in at the HF input HF_E. An amplifier stage 2 is connected to the HF input HF_E, for example a transistor. At the output A of the HF amplifier stage 2, the HF total path HF_G is divided in two HF partial paths 3, 4. This division is achieved by means of frequency-dividing networks, for example diplexers, which are not shown in FIG. 1 but adequately disclosed by the known prior art. FIG. 1 depicts, in an exemplary manner, the division into two partial paths 3, 4. However, it is understood that the total path HF_G can also be divided into three and more partial paths. Frequency-dividing networks (such as triplexers, etc.) that are known to the person skilled in the art are used to this end.

In the schematic circuit diagram as shown in FIG. 1, the HF total path HF_G is divided into a partial path 3 for a lower frequency band and a partial path 4 for an upper frequency band. When a division into a plurality of partial paths occurs, meaning into more than two partial paths, the total frequency band of the amplified HF signal is divided into a corresponding number of frequency bands. It is expedient for this distribution to be carried out at the output A of the HF amplifier stage 2.

The partial path 3 for the lower frequency band consists substantially of a matching network 7 for the lower frequency band that is connected to a low-pass filter 5 each on the input side A_E and on the output side A_A. The partial path 4 for the upper frequency band consists substantially of a matching network 8 for the upper frequency band that is connected to a high-pass filter 6 on the input side A_E and on the output side A_A.

The two partial paths 3, 4 are united at the HF output HF_A of the circuit layout 1, such that the total frequency band HF_G of the amplified signal is applied at the HF output HF_A.

FIG. 1 shows further that a control signal 9 for the suppression of harmonics is fed to the partial path 4 for the upper frequency band. It is expedient for the control signal 9 to be generated by a signal processing unit (not illustrated in FIG. 1).

Figure 2:
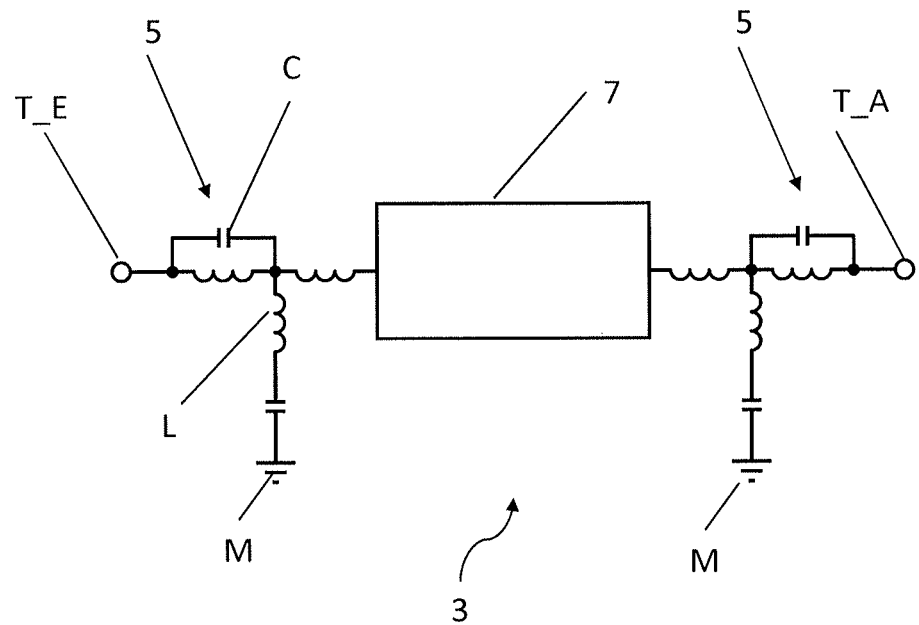
FIG. 2 depicts an exemplary circuit of the partial path for the lower frequency band from FIG. 1.

As explained previously regarding FIG. 1, the partial path 3 for the lower frequency band in FIG. 2 consists of three parts; these are a low-pass filter 5 on the input side and on the output side, respectively, with additional components C, L for the implementation of transmissions zeroes in the upper frequency band, as well as a smaller wide-band matching network 7 for matching the HF amplifier stage 2 in the lower frequency band. In this context, the term "smaller wide-band" means that, in contrast to a matching network of the prior art for processing the total bandwidth of a signal that was amplified by the HF amplifier stage, this matching network 7 has a smaller bandwidth.

The low-pass contents 5 of the circuit as depicted FIG. 2, particularly the parallel-resonant circuits consisting of the coils L and capacitors C, ideally generate a high-resistive termination for signals in the upper frequency band, which places only a negligible parasitic load on the HF partial path 3 for the upper frequency band, or no parasitic load at all. The person skilled in the art is familiar with low-pass filters 5 of this kind from the prior art.

The input T_E of this partial path 3 is connected to the output A of the HF amplifier stage 2 as shown in FIG. 1. The output T_A of this partial path 3 is connected to the HF output HF_A of the circuit layout 1 as shown in FIG. 1.

Figure 3:
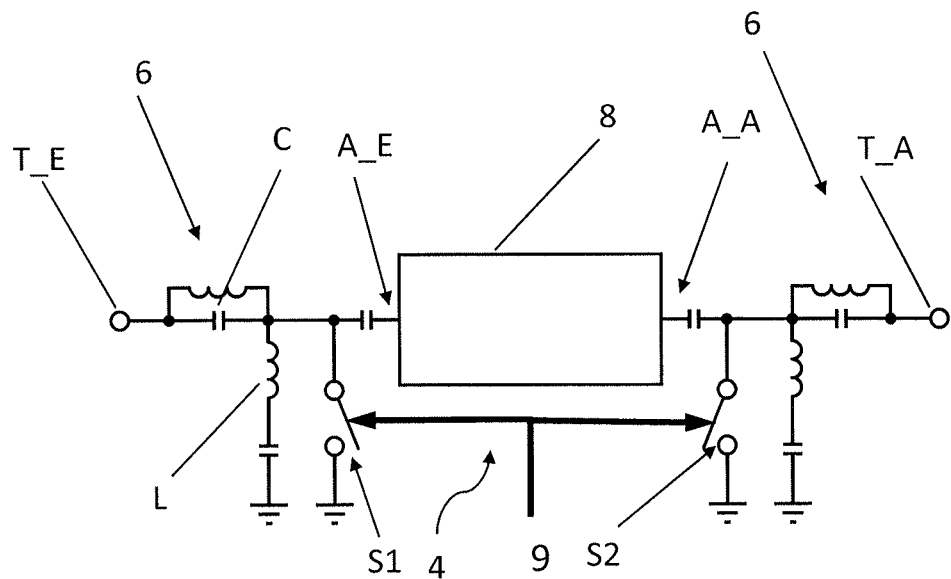
FIG. 3 depicts an exemplary circuit of the partial path for the upper frequency band from FIG. 1 with grounded switches for suppressing harmonics.

The partial path 4 for the upper frequency band in FIG. 3 also consists of three parts; these are a high-pass filter 6 on the input side and on the output side, respectively, with additional components C, L for implementing transmission zeroes in the lower frequency band and switches S1, S2 for the suppression of harmonics, when the same fall into the filter passband of the HF partial path 4 for high frequencies, as well as a smaller wide-band matching network 8 for matching the HF amplifier stage 2 in the upper frequency band. The high-pass contents 6 of the partial circuit of partial path 4, particularly parallel-resonant circuits consisting of coils L and capacitors C ideally generate a high-resistive termination for signals in the lower frequency band that places no parasitic load at all or only a negligible parasitic load on the frequency partial path 4 for the lower frequency band.

The partial circuit 4 comprises two switches S1, S2. One switch S1 is switchably disposed, grounded to the ground M, between input A_E of the matching network 8 and the high-pass filter 6 that is disposed on the input side. The other switch S2 is switchably disposed, grounded to the ground M, between the output A_A of the matching network 8 and the high-pass filter 6 that is disposed on the output side. The control signal 9 for the suppression of harmonics is fed to both switches S1, S2. Suitable interfaces are expediently provided for this purpose (not shown) that convert the control signal 9 to a corresponding switching signal. In FIG. 3, the two switches S1, S2 are connected to each other in such a manner that, when a control signal 9 is applied, both switches S1, S2 connect the input T_E of the partial path 4 and the output T_A of the partial path 4 to the ground M simultaneously.

Depending on the desired kind of suppression of harmonics, it is possible to omit one of the two switches S1 and S2. Due to the fact that any technical implementation of high-frequency switches is always associated with losses, it is possible to achieve comparatively better effectiveness when using only one switch.

According to an alternate embodiment, the partial path 4 can also, as shown in FIG. 3, include only a single switch S1, S2. Depending on where the switch S1, S2 is disposed, upon applying a control signal 9, the input T_E or the output T_A of the partial path 4 is connected to the ground M. If only a single switch S1, S2 is used, the level of suppression that can be achieved is less in comparison to the use of two switches S1, S2, as depicted FIG. 3, while, however, the level of effectiveness is better.

Figure 3A:
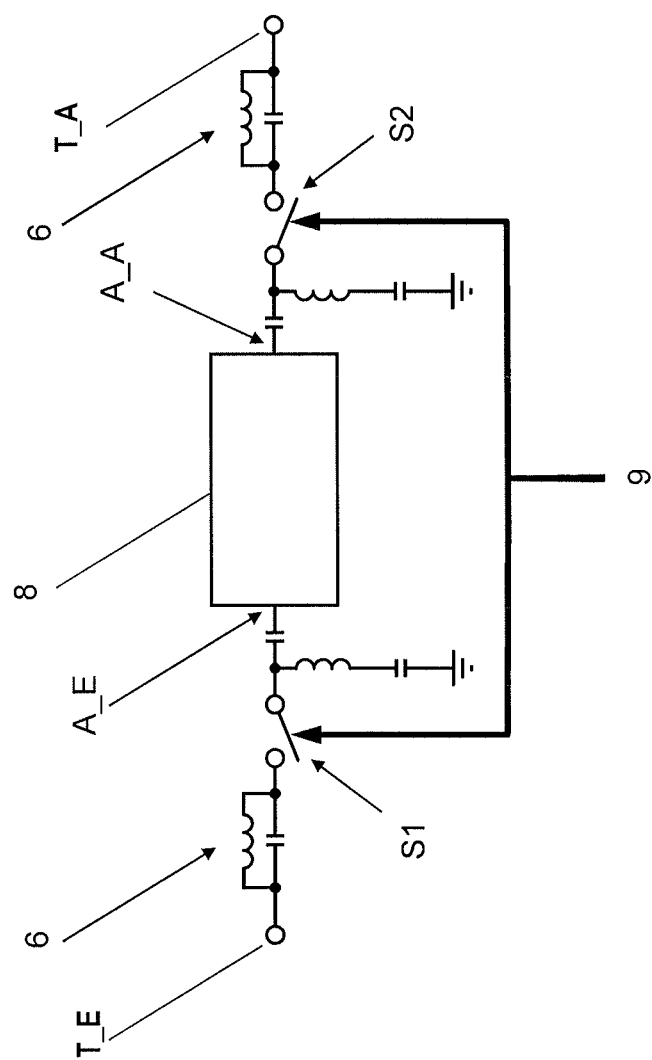
FIG. 3a depicts an exemplary circuit of the partial path for the upper frequency band from FIG. 1 with multi-circuit switches for the suppression of harmonics.

FIG. 3*a* is a representation of an exemplary circuit diagram of the partial path for the upper frequency band from FIG. 1 having two multi-circuit switches S1, S2 for the suppression of harmonics. The one switch S1 is connected therein to the input T_E of the partial path 4 and to the input A_E of the matching network 8. The other switch S2 switches the output A_A of the matching network 8 to the output T_A of the partial path 4. Opening a switch S1, S2 substantially causes a decoupling action of the partial path 4 from the circuit layout 1, as shown in FIG. 1.

According to a further embodiment of the invention, it is possible for the partial path 4 to have only one multi-circuit switch S1, S2, as depicted in FIG. 3*a*. According to yet another embodiment of the invention, it is also possible to combine, in the context of the partial path 4, the multi-circuit switches S1, S2, as shown in FIG. 3*a*, and the switches S1, S2 that are grounded to M, as shown in FIG. 3.

According to one further embodiment of the invention, the components, particularly the coils L and capacitors C, low-pass filter 5 of the partial circuit in FIG. 2, as well as the components, particularly the coils L and capacitors C, the high-pass filter 6 of the partial circuit from FIG. 3 or FIG. 3*a*, respectively are dimensioned such that the low-pass filter 5 and/or the high-pass filter 6 fulfill the role of the impedance-transforming effect and functionality of the matching networks 7, 8. Expediently, the matching networks 7, 8 with the correspondingly dimensioned low pass filters 5 and/or high pass filters 6 can be omitted. The person skilled in the art is familiar with such dimensioning.

Figure 4:
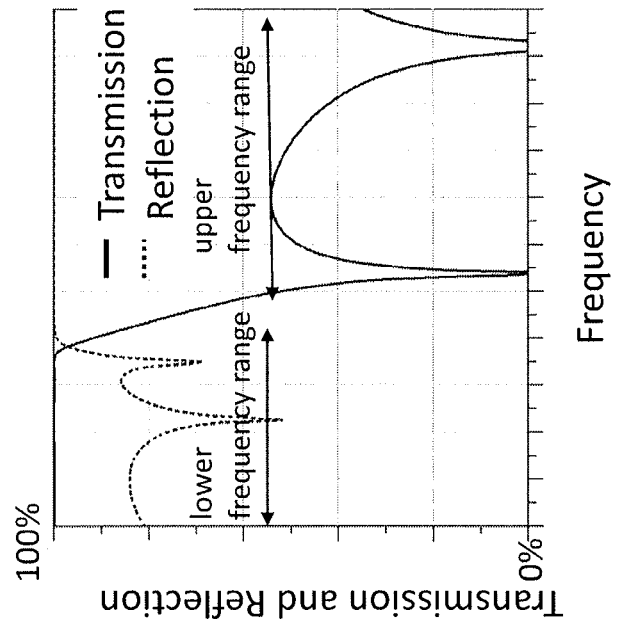
FIG. 4 is an exemplary representation of the transmission and reflection of a partial path according to FIG. 2.
Figure 5:
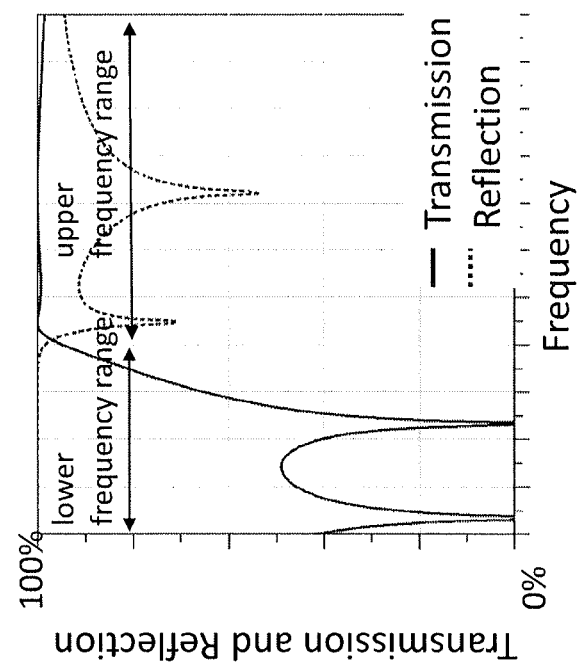
FIG. 5 is an exemplary representation of the transmission and reflection of a partial path according to FIG. 3, with open switches.
Figure 6:
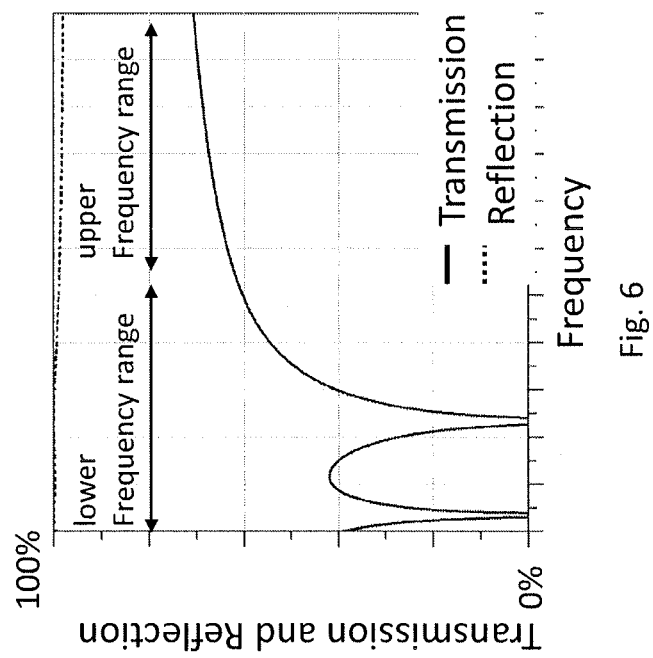
FIG. 6 is an exemplary representation of the transmission and reflection of a partial path according to FIG. 3, with closed switches.

FIGS. 4 to 6 substantially depict estimated HF properties, particularly transmission and reflection of the individual partial circuits in FIGS. 2 and 3 for the lower and/or upper frequency band. The axes of the diagrams that are shown in FIGS. 4 to 6 are represented without dimensions. The x-axis shows the respective frequency, with frequencies ascending from left to right. The y-axis depicts transmission and reflection, respectively, in a logarithmic representation from 0% at the bottom to 100% at the top.

In FIG. 4, a useful signal that is intensified in the lower partial band is routed under suitable matching conditions to the load via the partial circuit 3 in FIG. 2. Harmonics and useful waves in the upper partial band, meaning at high frequencies, are reflected at the input of the partial circuit. The representation contains the exemplary reflection as depicted by the dotted line and the transmission as depicted by the solid line. FIG. 4 makes it clear that the reflection assumes very small values in the lower frequency range. In the upper frequency range, the reflection is almost 100%. Complementary comments apply with regard to the transmission. In the lower frequency range, transmission is almost 100%; in the upper frequency range, transmission drops to very low values.

FIG. 5 depicts the estimated HF properties of the partial circuit 4 for the upper frequency band in FIG. 3, when the switch S1, S2 is open. A useful signal that is intensified in the upper partial band is routed to the load under suitable matching conditions. In the depiction, the exemplary reflection is indicated by the dotted line; the transmission is indicated by the solid line. FIG. 5 demonstrates that the reflection in the upper frequency range assumes small values. In the lower frequency range, the reflection is almost 100%. Complementary comments apply for the transmission. In the upper frequency range, transmission is almost 100%; in the lower frequency range, the transmission drops to very low values.

FIG. 6 depicts the estimated HF properties of the partial circuit 4 for the upper frequency band from FIG. 3, when the signal that is to be intensified is in the lower frequency band at the input of the amplifier circuit, and the one or several switches is/are closed. In this case, the harmonics that are generated on the transistor, and which fall in the passband of the high-pass filter, must be expediently reflected. In the representation, the exemplary reflection is indicated by the dotted line and the transmission by the solid line. From FIG. 6, it can be ascertained that the transmission in the lower frequency range also drops to very low values; in the upper frequency range, it climbs only slowly. Still, over the totality of the frequency range, the reflection is almost 100%. This means that the applied signal is almost completely reflected for the upper frequency band over the totality of the frequency band of the partial path 4, and it is not allowed to pass at the HF output HF_A.

Figure 7:
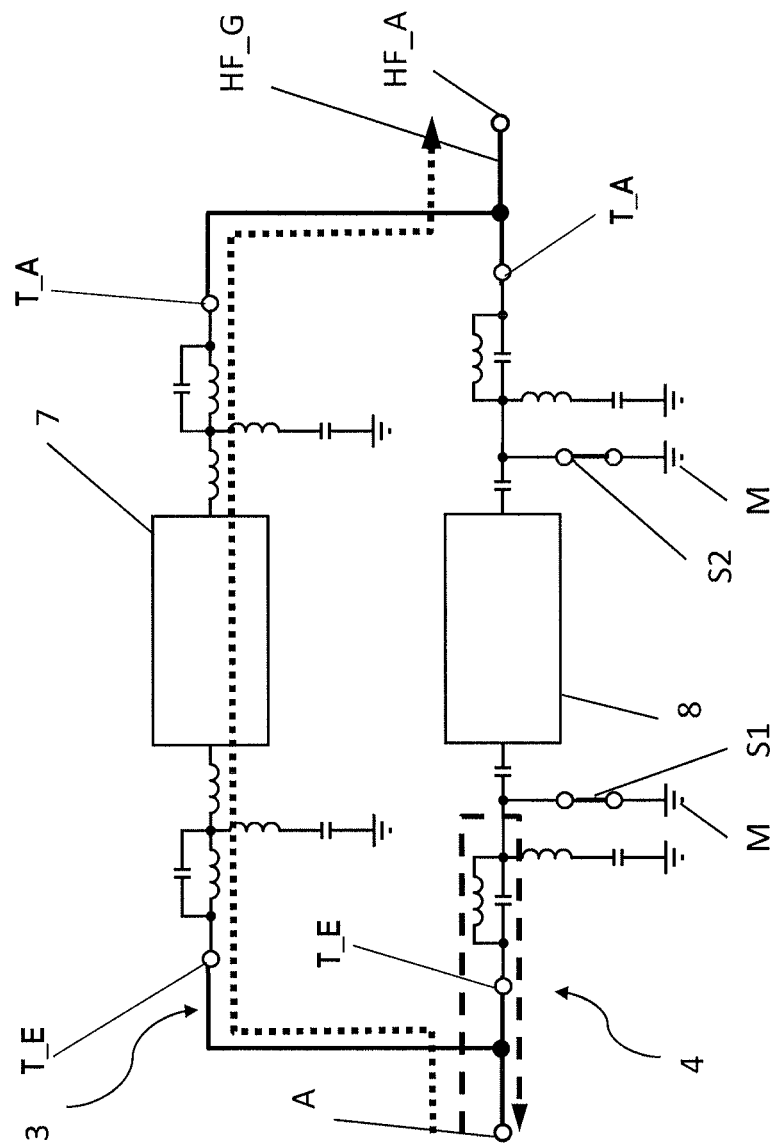
FIG. 7 depicts the signal flow for a signal with different spectral contents within a circuit layout according to FIG. 1 with closed switches in a partial path according to FIG. 3.
Figure 8:
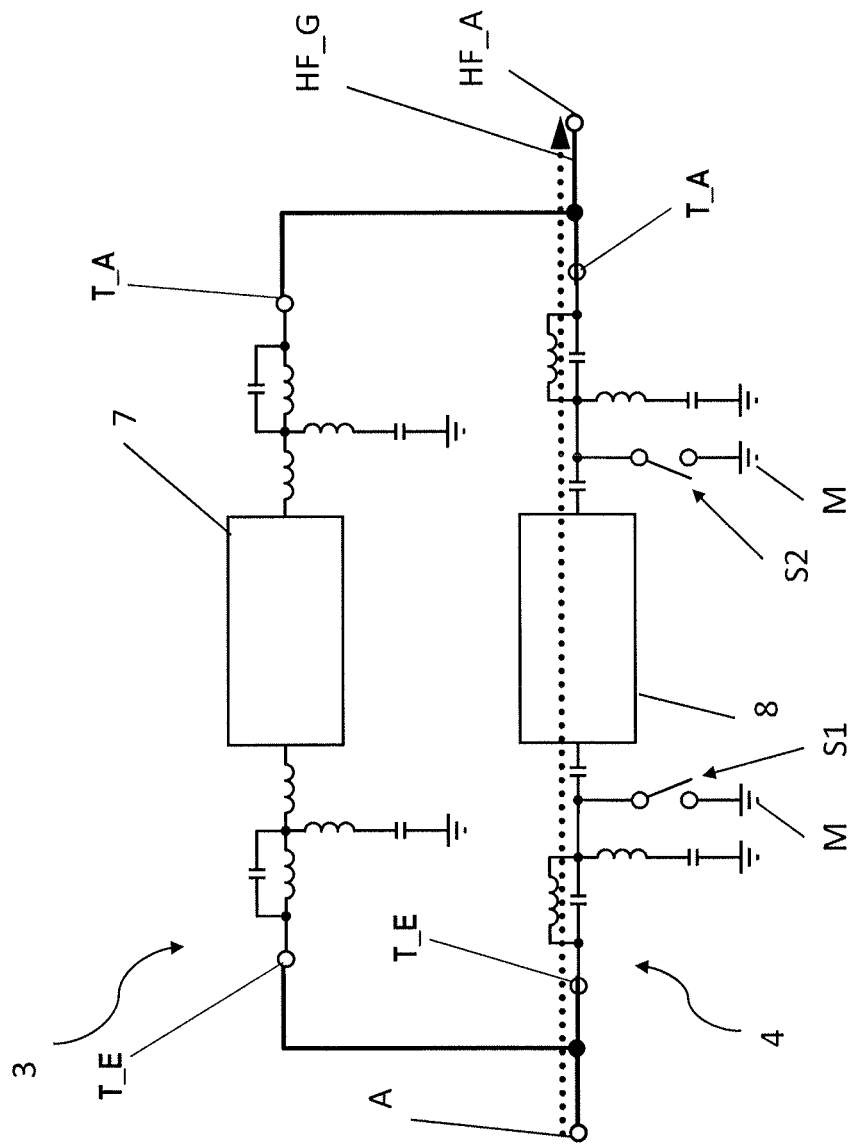
FIG. 8 depicts the signal flow for a signal with different spectral contents within a circuit layout according to FIG. 1 with open switches in a partial path according to FIG. 3.

The signal flow for signals having differing spectral content is schematically depicted by means of the arrows in FIG. 7 and FIG. 8. If signals are to be intensified in the lower frequency range, the signal (as indicated by the dotted arrow in FIG. 7) is basically routed via the partial path 3 for the lower frequency band (top partial circuit in FIG. 7). In this case, an external control signal 9 causes the two switches S1, S2 in the partial path 4 for the upper frequency band (bottom partial circuit in FIG. 7) to be closed. The harmonics that are generated in the HF amplifier stage 2, meaning, for example, the harmonics generated in the transistor as shown in FIG. 1 are expediently reflected in this manner, if they fall in the passband of the high-pass filter 6 (as indicated by the perforated arrow in FIG. 7).

When signals in the upper frequency band are to be intensified, the signals that are amplified in the HF amplifier stage 2 (as indicated by the dotted arrow in FIG. 8) are basically routed via partial path 4 for the upper frequency band (lower partial circuit in FIG. 8). To this end, the external control signal 9 causes the two switches S1, S2 in the partial path 4 for the upper frequency band (bottom partial circuit in FIG. 8) to open.

Another advantage of the invention demonstrates that it is possible to implement a matching network offering better approximation for the reduced frequency range that is optimized for maximum effectiveness, as compared to an implementation of the total passband of the HF amplifier.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

REFERENCE SIGNS

1 Circuit layout
2 HF amplifier stage
3 Partial path for lower frequency band
4 Partial path for upper frequency band
5 Low-pass filter
6 High-pass filter
7 Matching network for lower frequency band
8 Matching network for upper frequency band
9 Control signal
C Capacitor
L Coil
M Ground
S1 Switch
S2 Switch
A Output HF amplifier stage
HF_G HF total path
HF_A Output of circuit layout
HF_E Input of circuit layout
T_E Input of partial path
T_A Output of partial path
A_E Input of matching network
A_A Output of matching network

What is claimed is:

1. A circuit, comprising:
a high-frequency amplifier stage, which includes a high-frequency amplifier with an input and an output, wherein the output of the high-frequency amplifier is coupled to a total high-frequency path carrying a total frequency band;
a first partial frequency path coupled to the total high-frequency path, wherein the first partial frequency path includes
a first pass filter configured to pass a first partial frequency band,
a first matching network coupled to the first pass filter, wherein the first matching network is configured to match the high-frequency amplifier stage in the first partial frequency band, and
a further first pass filter coupled to the first matching network, wherein the further first pass filter is configured to pass the first partial frequency band;
a second partial frequency path coupled to the total high-frequency path, wherein the second partial frequency path includes
a second pass filter configured to pass a second partial frequency band,
a second matching network coupled to the second pass filter, wherein the second matching network is configured to match the high-frequency amplifier stage in the second partial frequency band, and
a further second pass filter coupled to the second matching network, wherein the further second pass filter is configured to pass the second partial frequency band; and
a coupling to an output of the first and second partial frequency paths, wherein the coupling combines an output of the first and second partial frequency paths into the total high-frequency path,
wherein one of the first and second partial frequency paths is coupled to a control signal line that is configured to control switching of the one of the first and second partial frequency paths,
wherein the one of the first and second partial frequency paths that is coupled to the control signal line comprises:
a first switch arranged an input the matching network of the one of the first and second partial frequency paths that is coupled to the control signal line; and
a second switch arranged on an output side of the matching network of the one of the first and second partial frequency paths that is coupled to the control signal line,
wherein the first and second switches are configured so that when a control signal is applied via the control signal line, the one of the first and second partial frequency paths is shorted to ground, which reflects signals in the one of the first and second partial frequency paths.

2. A circuit, comprising:
a high-frequency amplifier stage, which includes a high-frequency amplifier with an input and an output, wherein the output of the high-frequency amplifier is coupled to a total high-frequency path carrying a total frequency band;
a first partial frequency path coupled to the total high-frequency path, wherein the first partial frequency path includes
a first pass filter configured to pass a first partial frequency band,
a first matching network coupled to the first pass filter, wherein the first matching network is configured to match the high-frequency amplifier stage in the first partial frequency band, and
a further first pass filter coupled to the first matching network, wherein the further first pass filter is configured to pass the first partial frequency band;
a second partial frequency path coupled to the total high-frequency path, wherein the second partial frequency path includes
a second pass filter configured to pass a second partial frequency band,
a second matching network coupled to the second pass filter, wherein the second matching network is configured to match the high-frequency amplifier stage in the second partial frequency band, and
a further second pass filter coupled to the second matching network, wherein the further second pass filter is configured to pass the second partial frequency band; and
a coupling to an output of the first and second partial frequency paths, wherein the coupling combines an output of the first and second partial frequency paths into the total high-frequency path, wherein one of the first and second partial frequency paths is coupled to a control signal line that is configured to control switching of the one of the first and second partial frequency paths, wherein the one of the first and second partial frequency paths that is coupled to the control signal line comprises:

at least one multi-circuit switch arranged on an input side or an output side of the matching network of the one of the first and second partial frequency paths that is coupled to the control signal line, wherein the at least one multi-circuit switch is configured to decouple the one of the first and second partial frequency paths that is coupled to the control signal line from the circuit when a control signal is supplied via the control signal line.

3. The circuit of claim 1, wherein the first pass filter and further first pass filter are configured as the first matching network and the second pass filter and further second pass filter are configured as the second matching network.

4. The circuit of claim 1, further comprising:
frequency-dividing networks arranged between the output of the high-frequency amplifier stage and an input of the first and second partial frequency paths.

5. The circuit of claim 1, wherein the first and second switches are switching transistors, and the circuit is monolithically integrated on a single semiconductor chip.

6. The circuit of claim 2, wherein the at least one multi-circuit switch is a switching transistor, and the circuit is monolithically integrated on a single semiconductor chip.

7. The circuit of claim 1, wherein the first and second switches are microelectricalmechanical systems.

8. The circuit of claim 2, wherein the at least one multicircuit switch is a microelectricalmechanical system.

* * * * *